United States Patent
Lin et al.

(10) Patent No.: US 9,982,108 B2
(45) Date of Patent: May 29, 2018

(54) POLYIMIDE-CONTAINING LAYER AND METHOD FOR ETCHING POLYIMIDE-CONTAINING LAYER

(71) Applicant: INDUSTRIAL TECHNOLOGY RESEARCH INSTITUTE, Chutung, Hsinchu (TW)

(72) Inventors: Chih-Cheng Lin, Hsinchu (TW); Chyi-Ming Leu, Hsinchu County (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 715 days.

(21) Appl. No.: 13/900,324

(22) Filed: May 22, 2013

(65) Prior Publication Data

US 2014/0021169 A1    Jan. 23, 2014

(30) Foreign Application Priority Data

Jul. 18, 2012    (TW) .............................. 101125739 A

(51) Int. Cl.
*C08L 79/08*    (2006.01)
*C08K 3/36*    (2006.01)
(Continued)

(52) U.S. Cl.
CPC .................. *C08K 3/20* (2013.01); *C08K 3/22* (2013.01); *C08K 3/36* (2013.01); *C08J 7/12* (2013.01); *C08J 2379/08* (2013.01); *C08K 2003/2227* (2013.01); *H05K 1/0346* (2013.01); *H05K 2201/0154* (2013.01);
(Continued)

(58) Field of Classification Search
CPC .. C08L 79/08; C08K 3/22; C08K 3/36; C08K 3/20; C08K 2003/2227; C08J 7/12; H05K 1/0346; H05K 2203/0793; H05K 2201/0209; H05K 2201/0154;
(Continued)

(56) References Cited

U.S. PATENT DOCUMENTS 4,246,147 A * 1/1981 Bakos ................. B23K 35/224
                                                                427/259
4,371,579 A    2/1983 McCaskey et al.
(Continued)

FOREIGN PATENT DOCUMENTS

CN    1727436 A    2/2006
CN    1935629      3/2007
(Continued)

OTHER PUBLICATIONS

IBM Technical Disclosure Bulletin NN6051712 "Metalization of Polyimides" vol. 8, Iss 12, p. 1712. May 1, 1966.*
(Continued)

*Primary Examiner* — Callie Shosho
*Assistant Examiner* — John Freeman
(74) *Attorney, Agent, or Firm* — Muncy, Geissler, Olds & Lowe, P.C.

(57) ABSTRACT

The disclosure provides a polyimide-containing layer suitable for being etched by an alkaline solution and a method for etching a polyimide-containing layer. The polyimide-containing layer suitable for being etched by an alkaline solution includes 20-50 parts by weight of a silica dioxide, and 50-80 parts by weight of a polyimide.

5 Claims, 2 Drawing Sheets

(51) Int. Cl.
*C08J 7/12* (2006.01)
*C08K 3/20* (2006.01)
*C08K 3/22* (2006.01)
*H05K 1/03* (2006.01)

(52) U.S. Cl.
CPC ........... *H05K 2201/0209* (2013.01); *H05K 2203/0769* (2013.01); *H05K 2203/0793* (2013.01); *Y10T 428/259* (2015.01); *Y10T 428/31721* (2015.04)

(58) Field of Classification Search
CPC .... H05K 2203/0769; Y10T 428/31721; Y10T 428/259
See application file for complete search history.

(56) References Cited

U.S. PATENT DOCUMENTS

| | | | |
|---|---|---|---|
| 4,528,303 | A | 7/1985 | Segaud |
| 5,004,774 | A | 4/1991 | Yeo et al. |
| 5,147,953 | A | 9/1992 | Corley |
| 5,628,661 | A | 5/1997 | Kim et al. |
| 5,773,536 | A * | 6/1998 | Mizoguchi ............... C08K 3/36 205/164 |
| 6,767,644 | B2 | 7/2004 | Aida |
| 2004/0094512 | A1* | 5/2004 | Ono ............... C08J 7/12 216/83 |
| 2006/0194037 | A1 | 8/2006 | Fink et al. |
| 2007/0039921 | A1 | 2/2007 | Samukawa |
| 2007/0066090 | A1 | 3/2007 | Ono et al. |
| 2007/0243370 | A1* | 10/2007 | Wakizaka ............... G02B 1/111 428/313.3 |
| 2008/0161473 | A1 | 7/2008 | Leu et al. |
| 2010/0035066 | A1* | 2/2010 | Lu ............... B32B 15/08 428/416 |
| 2011/0130495 | A1* | 6/2011 | Leu ............... B82Y 30/00 524/104 |
| 2012/0328830 | A1* | 12/2012 | Hoshino ............... G02B 1/113 428/149 |

FOREIGN PATENT DOCUMENTS

| | | |
|---|---|---|
| CN | 1953643 | 4/2007 |
| CN | 101143500 A | 3/2008 |
| CN | 101289542 A | 10/2008 |
| CN | 101311224 A | 11/2008 |
| CN | 102020850 | 4/2011 |
| CN | 102086303 | 6/2011 |
| CN | 102627856 A | 8/2012 |
| JP | 63-184353 | 7/1988 |
| JP | H0994962 | 4/1997 |
| JP | 10097081 A * | 4/1998 |
| JP | 2000058535 A | 2/2000 |
| JP | 2009018523 A | 1/2009 |
| TW | 200827406 | 7/2008 |
| TW | 201116861 | 5/2011 |
| TW | 201124456 | 7/2011 |
| TW | 201224656 A | 6/2012 |

OTHER PUBLICATIONS

Yuichi Niibori , Masahisa Kunita , Osamu Tochiyama & Tadashi Chida (2000) Dissolution Rates of Amorphous Silica in Highly Alkaline Solution, Journal of Nuclear Science and Technology, 37:4, 349-357, DOI: 10.1080/18811248.2000.9714905.*
Machine translation of JP 10097081 (1998).*
"Simple Method for Preparation of Porous Polyimide Film with an Ordered Surface Based on in Situ Self-Assembly of Polyamic Acid and Silica Microspheres" Chao Wang, Qihua Wang, and Tingmei Wang Langmuir 2010 26 (23), 18357-18361 DOI: 10.1021/la103473u.*
Taiwanese Office Action dated Sep. 25, 2014, as issued in corresponding Taiwan Patent Application No. 101125739.
Jeong et al., "Etching polyimide with a nonequilibrium atmospheric-pressure plasma jet", J. Vac. Sci. Technology, Sep./Oct. 1999, pp. 2581-2585.
Peixoto et al., "Wet anisotropic etching of polyimide"., Annals of the International Meeting on Chemical Sensors, Proc. 8th Intern. Meeting on Chemical Sensors, IMCS 2000, 2000, pp. 528, Switzerland.
Ma et al., "Study of Polyimide as Sacrificial Layer with O2 Plasma Releasing for Its Application in MEMS Capacitive FPA Fabrication", International Conference on Electronic Packaging Technology & High Density Packaging, 2009, pp. 526-529.
Oh et al., "Fabrication of a thermally isolated and pre-amplified transistor module with polyimide micro-wires for cryogenic detectors", J Low Temp Phys, 2008, pp. 1003-1008.
Cheang et al., "Optimization of Photosensitive Polyimide Process for Cost Effective Packaging", surface Mount Technology Seminar, 1996, pp. 1-18.
Chinese Office Action dated May 6, 2015, as issued in corresponding China Patent Application No. 201210315755.1 (7 pages).
Office action from corresponding CN application No. 201210315755.1, dated Nov. 27, 2015, 7 pages.

* cited by examiner

POLYIMIDE-CONTAINING LAYER AND METHOD FOR ETCHING POLYIMIDE-CONTAINING LAYER

CROSS REFERENCE TO RELATED APPLICATIONS

This application is based upon and claims the benefit of priority from the prior Taiwan Patent Application No. 101125739, filed on Jul. 18, 2012, the entire contents of which are incorporated herein by reference.

TECHNICAL FIELD

The disclosure relates to a polyimide-containing layer.

BACKGROUND

A thermosetting material, such as polyimide (PI), is a material with high heat resistance, a great mechanical property, a superior optical property and a low dielectric constant. Thus, the thermosetting material has been widely applied in flexible printed circuit (FPC) boards, electronic packages, optical waveguides, alignment films of liquid crystal displays (LCD) and microfluidic devices. When applied, the polyimide material typically needs to be patterned by pattern definition technology to form the desired pattern structure for use.

The polyimide material, however, has to be patterned under specific process conditions. For example, the polyimide material can be patterned by laser machining technology. When the laser machining technology patterns the thermosetting material, the laser directly irradiates the thermosetting material layer through a mask to remove a portion of the thermosetting material layer to complete the thermosetting material pattern structures.

Therefore, a novel method for patterning a polyimide (PI) layer which overcomes the above difficulties and inconveniences is desired.

BRIEF SUMMARY

An exemplary embodiment of the disclosure provides a polyimide-containing layer, wherein the polyimide-containing layer can include: 20-50 parts by weight of an inorganic oxide, and 50-80 parts by weight of a polyimide.

Another exemplary embodiment of the disclosure provides a method for etching a polyimide-containing layer including the following steps. First, a polyimide-containing composition is provided. The polyimide-containing composition is coated on a substrate. The polyimide-containing composition is formed to a layer on the substrate after drying. The layer is then etched by an alkaline solution. Particularly, the polyimide-containing composition includes: 20-50 parts by weight of an inorganic oxide; and, 50-80 parts by weight of a polyimide, wherein the inorganic oxide and the polyimide are dispersed in a solvent.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
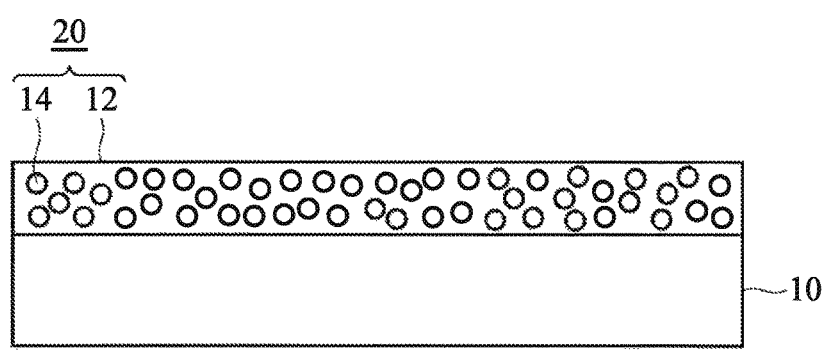
FIG. 1 is a cross-section showing a polyimide-containing layer according to an embodiment of the disclosure for using in an etching process employing an alkaline solution.

The disclosure provides a polyimide-containing layer, and a method for etching the polyimide-containing layer. According to an embodiment of the disclosure, the polyimide-containing layer is suitable for application in an etching process with an alkaline solution. According to an embodiment of the disclosure, the polyimide-containing layer includes: 20-50 parts by weight of an inorganic oxide; and 50-80 parts by weight of a polyimide. The inorganic oxide can be inorganic silicon oxide, inorganic alumina or combinations thereof. The inorganic oxide can have a particle size of 1-600 nm, such as 1-300 nm, 1-200 nm, or 1-100 nm. The method for fabricating the aforementioned polyimide-containing layer can include the following steps. First, a polyimide-containing composition is provided, wherein the polyimide-containing composition includes: 20-50 parts by weight of an inorganic oxide; and 50-80 parts by weight of a polyimide, wherein the inorganic oxide and the polyimide are dispersed in a solvent. The solvent can be a cycloketone solvent, amide solvent, phenol solvent or combinations thereof. The polyimide-containing composition can have a solid content of 10-40 wt %, and the polyimide-containing composition can have a viscosity of more than 1000 cps. Next, the polyimide-containing composition is coated on a substrate 10, as shown in FIG. 1, forming a coating, wherein the material of the substrate is unlimited and can be any suitable substrate (such as glass substrate, plastic substrate, or flexible copper clad laminate), or any suitable film (such as polymer film, conductive film, or inorganic dielectric film). Finally, the coating is subjected to a drying process, forming a layer, as shown in FIG. 1. The layer 20 includes inorganic oxide (such as silicon dioxide particles) 12 dispersed among the polyimide 14.

The polyimide of the disclosure can be a fluorine-free polyimide, and the method for preparing the polyimide can be a polycondensation method, which is described as below. First, a diamine is reacted with a dianhydride in a polar solvent, obtaining a poly(amic acid) (PAA) (a precursor of a polyimide). Next, the poly(amic acid) is reacted via a thermal process (with a reaction temperature of 300-400° C.) or a chemical process to undergo an imidization reaction. For example, the diamine can be but is not limited to m-phenylenediamine (m-PDA), p-phenylenediamine (p-PDA), 4,4'-oxydianiline (4,4'-ODA), 3,4'-oxydianiline (3,4'-ODA), 1,4-bis(4-aminophenoxy)benzene (1,4-APB), 1,3-bis(4-aminophenoxy)benzene (1,3-APB), 1,2-bis(4-aminophenoxy)benzene (1,2-APB), 1,3-bis(3-aminophenoxy)benzene (APR-133), 2,5-bis(4-arninophenoxy)toluene), bis(4-[4-aminophenoxy]phenyl)ether (BAPE), 4,4'-bis[4-aminophenoxy]biphenyl (BAPB), 2,2-bis[4-(4-aminophenoxy)]phenyl propane (BAPP), bis-4-(4-aminophenoxy)phenyl sulfone (BAPS), 2,2'-bis(trifluoromethyl) 4,4'-diaminobiphenyl (TFMB), 1,4-diaminobenzene (PPD), or combinations thereof. The dianhydride can be but is not limited to pyromellitic dianhydride (PMDA), 4,4'-(Hexafluoroisopropylidene)-diphthalic anhydride (6FDA), 4,4'-oxydiphthalic anhydride (ODPA), 1,3-bis(4-aminophenoxy)benzene (RODA), 4,4'-Biphthalic dianhydride (BPDA), 4,4'-bisphenol A dianhydride (BPADA), hydroquinnone diphtalic anhydride (HQDA), or combinations thereof.

Figure 2:
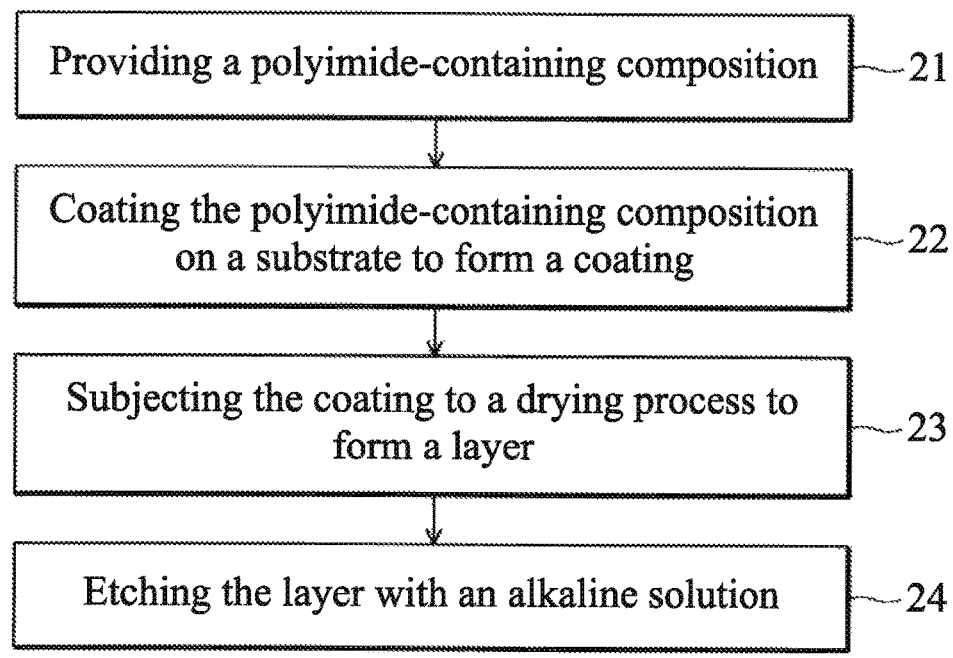
FIG. 2 is a flow chart illustrating a method for etching a polyimide-containing layer according to an embodiment of the disclosure.

The method for etching a polyimide-containing layer includes the following steps, as shown in FIG. 2. First, a polyimide-containing composition is provided (step 21), wherein the polyimide-containing composition includes 20-50 parts by weight of an inorganic oxide; and 50-80 parts by weight of a polyimide, wherein the inorganic oxide and the polyimide are dispersed in a solvent. Next, the polyimide-containing composition is coated on a substrate to form a coating (step 22), wherein the material of the substrate is unlimited and can be any suitable substrate (such as glass substrate, plastic substrate, or flexible copper clad laminate), or any suitable film (such as polymer film, conductive film, or inorganic dielectric film). Next, the coating is subjected to a drying process (to undergo a ring-closure reaction), forming a layer on the substrate (step 23). Finally, the layer is etched with an alkaline solution (step 24). According to some embodiments of the disclosure, the polyimide-containing composition can have a solid content of 10-40 wt %, and the Polyimide-containing composition can have a viscosity of more than 1000 cps. Further, the alkaline solution can include water, alkanolamine, and alkali metal hydroxide, wherein the alkali metal hydroxide can include potassium hydroxide, or sodium hydroxide. The weight ratio between the alkanolamine and the alkali metal hydroxide is from 1:4 to 4:1. The weight percentage of the alkanolamine and alkali metal hydroxide can be 20-30 wt %, based on the weight of the alkaline solution. For example, the alkanolamine can be ethanolamine, or isopropanolamine.

The following examples are intended, to illustrate the invention more fully without limiting its scope, since numerous modifications and variations will be apparent to those skilled in this art.

Preparation of a Polymide Solution

Preparation Example 40.88 g (0.204 mol) of 4,4'-Oxydianiline (ODA) and 403.55 g of dimethylacetamide (DMAc) were added into a bottle and mixed at room temperature. After dissolution was completed, 60 g (0.204 mol) of 3,3',4,4'-Biphenyltetracarboxylic dianhydride (BPDA) was added batchwise three-times to the bottle with a time interval of 30 min. Next, the mixture was stirred at room temperature, obtaining a viscous liquid. After further stirring for 8 hrs, a golden yellow viscous liquid was obtained. Next, 168.1 g of dimethylacetamide (DMAc) was added to the bottle to obtain a solution, wherein the solution had a solid content of 15 wt %. Particularly, the solution included a polyimide having a repeating unit represented by Preparation of a Polyimide-Containing Layer Example 1

The polyimide solution of Preparation Example 1 was coated on a soda glass by a doctor blade. The coating was baked respectively at 50° C., 150° C., 210° C. and 400° C. for 30 min, obtaining a polyimide-containing layer (1).

Example 2

30 g of the polyimide solution of Preparation Example 1 was mixed with 1.18 g of a silicon dioxide dispersion (20 wt %, the silicon dioxide was dispersed in a DMAc solvent, wherein the particle size of the silicon dioxide was from 10 to 15 nm), obtaining a polyimide-containing composition. Particularly, the weight ratio of the silicon dioxide particle and the polyimide was 5:95. Next, after mixing was completed, the composition was coated on a soda glass by a doctor blade. The coating was baked respectively at 50° C., 150° C., 210° C., and 400° C. for 30 min, obtaining a polyimide-containing layer (2).

Example 3

Example 3 was performed as the method as described in Example 2 except that the weight ratio of the silicon dioxide particles and the polyimide was 10:90, obtaining a polyimide-containing layer (3).

Example 4

Example 4 was performed as the method as described in Example 2 except that the weight ratio of the silicon dioxide particles and the polyimide was 15:85, obtaining a polyimide-containing layer (4).

Example 5

Example 5 was performed as the method as described in Example 2 except that the weight ratio of the silicon dioxide particles and the polyimide was 20:80, obtaining a polyimide-containing layer (5).

Example 6

Example 6 was performed as the method as described in Example 2 except that the weight ratio of the silicon dioxide particles and the polyimide was 30:70, obtaining a polyimide-containing layer (6).

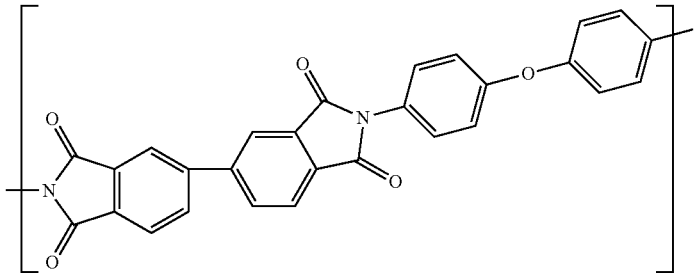

Example 7

Example 7 was performed as the method as described in Example 2 except that the weight ratio of the silicon dioxide particles and the polyimide was 40:60, obtaining a polyimide-containing layer (7).

Example 8

Example 8 was performed as the method as described in Example 2 except that the weight ratio of the silicon dioxide particles and the polyimide was 50:50, obtaining a polyimide-containing layer (8).

Example 9

30 g of the polyimide solution of Preparation Example 1 was mixed with 9.64 g of a silicon dioxide dispersion (20 wt %, the silicon dioxide was dispersed in a DMAc solvent, wherein the particle size of the silicon dioxide was from 70 to 100 nm), obtaining a polyimide-containing composition. Particularly, the weight ratio of the silicon dioxide particles and the polyimide was 30:70. Next, after mixing was completed, the composition was coated on a soda glass by a doctor blade. The coating was baked respectively at 50° C., 150° C., 210° C., and 400° C. for 30 min, obtaining a polyimide-containing layer (9).

Example 10

Example 10 was performed as the method as described in Example 9 except that the weight ratio of the silicon dioxide particles and the polyimide was 40:60, obtaining a polyimide-containing layer (10).

Example 11

30 g of the polyimide solution of Preparation Example 1 was mixed with 9.64 g of a silicon dioxide dispersion (20 wt %, the silicon dioxide was dispersed in a DMAc solvent, wherein the particle size of the silicon dioxide was from 200 to 600 nm), obtaining a polyimide-containing composition. Particularly, the weight ratio of the silicon dioxide particles and the polyimide was 30:70. Next, after mixing was completed, the composition was coated on a soda glass by a doctor blade. The coating was baked respectively at 50° C., 150° C., 210° C., and 400° C. for 30 min, obtaining a polyimide-containing layer (11).

Example 12

30 g of the polyimide solution of Preparation Example 1 was mixed with 9.64 g of a silicon dioxide dispersion (20 wt %, the silicon dioxide was dispersed in a DMAc solvent, wherein the particle size of the silicon dioxide was from 5 to 45 μm), obtaining a polyimide-containing composition. Particularly, the weight ratio of the silicon dioxide particles and the polyimide was 30:70. Next, after mixing was completed, the composition was coated on a soda glass by a doctor blade. The coating was baked respectively at 50° C., 150° C., 210° C., and 400° C. for 30 min, obtaining a polyimide-containing layer (12).

Etching Test

Example 13

The polyimide-containing layers (1)-(6) of Examples 1-6 were respectively bathed in an alkaline solution (including water, KOH, and ethanolamine, wherein the weight ratio of KOH and ethanolamine was 2:1, and the weight percentage of alkanolamine and KOH was 30 wt %, based on the weight of the alkaline solution), for performing an etching test (with a temperature of 70° C.). The time, which was spent for completely removing the polyimide-containing layers via etching, was measured, and the results were as shown in Table 1:

TABLE 1

|  | weight percentage of the silicon dioxide particles (wt %) | etching time |
|---|---|---|
| polyimide-containing layer (2) | 5 wt % | 1 hour |
| polyimide-containing layer (3) | 10 wt % | 50 min |
| polyimide-containing layer (4) | 15 wt % | about 40 min |
| polyimide-containing layer (5) | 20 wt % | <10 min |
| polyimide-containing layer (6) | 30 wt % | about 2 min |
| polyimide-containing layer (1) | 0 wt % | >1 hr |

As shown in Table 1, when the weight percentage of the silicon dioxide particles in the polyimide-containing layer was more than 20 wt % (based on the weight of the silicon dioxide particles and the polyimide), the layer was etched rapidly under a normal alkaline solution environment (the time for completely etching the layer was less than 10 min).

Example 14

The polyimide-containing layers (6)-(12) of Examples 6-12 were respectively bathed in an alkaline solution (including water, KOH, and ethanolamine, wherein the weight ratio of KOH and ethanolamine was 2:1, and the weight percentage of alkanolamine and KOH was 30 wt %, based on the weight of the alkaline solution), for performing an etching test (with a temperature of 70° C.). The time, which was spent for completely removing the polyimide-containing layers via etching, was measured, and the results were as shown in Table 2:

TABLE 2

|  | Particle size of the silicon dioxide particles | weight ratio between the silicon oxide and polyimide | etching time |
|---|---|---|---|
| polyimide-containing layer (6) | 10-15 nm | 3:7 | about 2 min |
| polyimide-containing layer (7) | 10-15 nm | 4:6 | about 90 sec |
| polyimide-containing layer (8) | 10-15 nm | 5:5 | about 30 sec |
| polyimide-containing layer (9) | 70-100 nm | 3:7 | about 7 min |
| polyimide-containing layer (10) | 70-100 nm | 4:6 | about 3 min |
| polyimide-containing layer (11) | 200-600 nm | 3:7 | <10 min |
| polyimide-containing layer (12) | 5-45 μm | 3:7 | >15 min |
| polyimide-containing layer (1) | Pure polyimide | | >1 hr |

As shown in Table 2, with the same added amount of silicon dioxide particles (30% wt), the smaller the particle size of the silicon dioxide particles, the faster the etching rate of the polyimide-containing layer. Namely, the etching rate of the polyimide-containing layer was directly correlated with the overall surface area of the silicon dioxide particles. Further, when the particle size of the silicon dioxide particle was equal to or less than 600 nm (such as equal to or less than 200 nm or 100 nm), the polyimide-containing layer having the silicon dioxide particle was etched rapidly under a normal alkaline solution environment (the time for completely etching the layer is less than 10 min).

Example 15

The polyimide-containing layers (6), (9), (11), and (12) of Examples 6, 9, 11, and 12 were respectively bathed in an alkaline solution (including water, KOH, and ethanolamine, wherein the weight ratio of KOH and ethanolamine was 4:1, and the weight percentage of alkanolamine and KOH was 30 wt %, based on the weight of the alkaline solution), for performing an etching test (with a temperature of 70° C.). The time, which was spent for completely removing the polyimide-containing layers via etching, was measured, and the results were as shown in Table 3:

TABLE 3

| | particle size of the silicon dioxide particles | etching time | haze value |
|---|---|---|---|
| polyimide-containing layer (6) | 10-15 nm | about 150 sec | 1.48 |
| polyimide-containing layer (9) | 70-100 nm | about 10 min | 8.21 |
| polyimide-containing layer (11) | 200-600 nm | about 14 min | 61.7 |
| polyimide-containing layer (12) | 5-45 μm | about 19 min | 82.3 |

As shown in Table 3, the etching rate was reduced when the alkaline solution had a lower concentration of ethanolamine. Therefore, the etching rate for etching the polyimide-containing layer can be controlled by adjusting the concentration of ethanolamine. Further, the polyimide-containing layer had an obviously rough surface and a higher haze value (>60) when the particle size of the silicon dioxide particles was more than 100 nm.

Analysts of Anti-Chemical Properties

Example 16

Chemical agents used with TFT (thin film transistor) fabrication, such as oxalic acids, photoresist chemical agents (photosensitive organic resin), developing agents (2%~3% tetra methyl ammonium hydroxide (TMAH) aqueous solution), and strippers (such as Ethers, alcohols, ethers, alkanolamine, or combinations thereof) were dropped on the polyimide-containing layers (6) of Example 6, respectively. After baking at 50° C. for 1 hr, it was observed as to whether cracks had occurred in the layers. The results are shown in Table 4:

TABLE 4

| | polyimide-containing layer (1) | polyimide-containing layer (6) |
|---|---|---|
| oxalic acid | No cracks had occurred | No cracks had occurred |
| photoresist | No cracks had occurred | No cracks had occurred |
| developing agent | No cracks had occurred | No cracks had occurred |
| stripper | No cracks had occurred | No cracks had occurred |

As shown in Table 4, even when the polyimide-containing layer (6) further included silicon oxide particles in comparison with the polyimide-containing layer (1) (pure PI), the polyimide-containing layer (6) still exhibited good anti-chemical properties. Therefore, the polyimide-containing layer, including the inorganic oxide particles of the disclosure, is suitable for being used in the fabrication processes of TFTs (thin film transistor).

Accordingly, in the method for etching a polyimide-containing layer via an alkaline solution of the disclosure, the etching process can be simplified for etching the polyimide-containing layer due to the inorganic oxide. Since the polyimide-containing layer of the disclosure is more apt to be etched by a normal alkaline solution, the polyimide-containing layer can be etched in the absence of electric plasma equipments. Therefore, the etching time for etching the polyimide-containing layer can be reduced, and the method of the disclosure facilitates the etching of a polyimide-containing layer.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for etching a polyimide-containing layer, comprising:
    providing a polyimide-containing composition, wherein the polyimide-containing composition consists of:
        a solvent selected from the group consisting of a cycloketone solvent, an amide solvent, a phenol solvent, and combinations thereof;
        20-50 parts by weight of an inorganic silicon oxide having a particle size of 10-100 nm; and
        50-80 parts by weight of a polyimide, wherein the inorganic silicon oxide and the polyimide are dispersed in the solvent;
    coating the polyimide-containing composition on a substrate;
    drying the polyimide-containing composition to form a polyimide-containing layer on the substrate; and
    etching the polyimide-containing layer with an alkaline solution to completely remove the polyimide-containing layer, wherein the alkaline solution comprises water, an alkanolamine, and an alkali metal hydroxide.

2. The method as claimed in claim 1, wherein the polyimide-containing composition has a solid content of 10-40 wt %.

3. The method as claimed in claim 1, wherein the polyimide-containing composition has a viscosity of more than 1000 cps.

4. The method as claimed in claim 1, wherein the weight ratio between the alkanolamine and the alkali metal hydroxide is from 1:4 to 4:1.

5. The method as claimed in claim 1, wherein the weight percentage of the alkanolamine and alkali metal hydroxide is 20-30 wt %, based on the weight of the alkaline solution.

* * * * *